(12) United States Patent
Lytle

(10) Patent No.: US 7,729,898 B1
(45) Date of Patent: Jun. 1, 2010

(54) METHODS AND APPARATUS FOR IMPLEMENTING LOGIC FUNCTIONS ON A HETEROGENEOUS PROGRAMMABLE DEVICE

(75) Inventor: Craig Lytle, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 700 days.

(21) Appl. No.: 10/274,006

(22) Filed: Oct. 17, 2002

(51) Int. Cl.
*G06F 9/455* (2006.01)
*G06F 17/50* (2006.01)
*G01D 3/00* (2006.01)
*G01M 19/00* (2006.01)
*G01P 21/00* (2006.01)

(52) U.S. Cl. .................. 703/26; 716/1; 702/108
(58) Field of Classification Search ............ 703/26; 716/1; 702/108
See application file for complete search history.

(56) References Cited

U.S. PATENT DOCUMENTS

| 5,737,234 | A  | * | 4/1998  | Seidel et al. ............ 716/1 |
| 5,910,898 | A  | * | 6/1999  | Johannsen ............... 716/1 |
| 6,199,031 | B1 | * | 3/2001  | Challier et al. .......... 703/14 |
| 6,269,467 | B1 | * | 7/2001  | Chang et al. ............ 716/1 |
| 6,425,116 | B1 | * | 7/2002  | Duboc et al. ............ 716/18 |
| 6,448,910 | B1 | * | 9/2002  | Lu ........................... 341/51 |
| 2001/0016933 | A1 | * | 8/2001 | Chang et al. ............ 716/1 |
| 2001/0018756 | A1 | * | 8/2001 | Chang et al. ............ 716/1 |
| 2001/0025369 | A1 | * | 9/2001 | Chang et al. ............ 716/18 |
| 2002/0004931 | A1 | * | 1/2002 | Stralen ..................... 716/18 |
| 2002/0073380 | A1 | * | 6/2002 | Cooke et al. ............ 716/1 |
| 2002/0080174 | A1 | * | 6/2002 | Kodosky et al. ........ 345/762 |
| 2003/0101307 | A1 | * | 5/2003 | Gemelli et al. .......... 710/305 |
| 2003/0163298 | A1 | * | 8/2003 | Odom et al. ............. 703/21 |
| 2006/0248311 | A1 | * | 11/2006 | Jennings .................. 712/22 |

OTHER PUBLICATIONS

Brian Dipert, "Do Combo chips compute (or even compile)," EDN, Feb. 15, 2001, pp. 101-118. [www.ednmag.com].

* cited by examiner

*Primary Examiner*—Kamini S Shah
*Assistant Examiner*—David Silver
(74) *Attorney, Agent, or Firm*—Weaver Austin Villenueve & Sampson, LLP

(57) ABSTRACT

A heterogeneous device including multiple types of resources is provided to implement multiple logic functions. Logic functions are provided with multiple configuration options. In one example, an optimal set of configuration options along with a target device are selected using cost and resource availability information associated with multiple heterogeneous programmable chips and the configuration options provided with the logic blocks.

32 Claims, 8 Drawing Sheets

Figure 6

Configuration Option Selector Results 601

FIR Filter 563, FFT Core 573 = 1500 LEs, 10 DSP Blocks = Device C — 611

FIR Filter 563, FFT Core 575 = 6900 LEs, 6 DSP Blocks = Device C — 613

FIR Filter 565, FFT Core 573 = 3700 LEs, 6 DSP Blocks = Device A — 615

FIR Filter 565, FFT Core 575 = 9100 LEs, 2 DSP Blocks = Device C — 617

METHODS AND APPARATUS FOR IMPLEMENTING LOGIC FUNCTIONS ON A HETEROGENEOUS PROGRAMMABLE DEVICE

BACKGROUND OF THE INVENTION

1. Field of the Invention

The present invention relates to implementing logic blocks on a heterogeneous programmable device. More specifically, the present invention relates to methods and apparatus for enabling the efficient implementation of multiple logic functions on a heterogeneous programmable chip.

2. Description of the Prior Art

A number of benefits have spurred efforts towards heterogeneous devices. In one example, integrating multiple types of resources on a single programmable chip allows efficient and effective processing using a variety of different logic mechanisms and functions. The integration efforts have been focused in several areas. In one example, programmable chips are provided with not only logic elements and memory, but specialized digital signal processing (DSP) blocks as well. Integrating DSP blocks onto a programmable chip allow programmable devices to more effectively compete in performance terms with custom designed ASICs.

However, mechanisms for efficiently implementing multiple logic functions on a heterogeneous programmable device are limited. It is therefore desirable to provide improved methods and apparatus for implementing multiple logic functions on heterogeneous devices.

SUMMARY OF THE INVENTION

Methods and apparatus are provided for implementing multiple logic functions on a heterogeneous device including multiple types of resources. Logic functions are provided with multiple configuration options. In one example, an optimal set of configuration options along with a target device are selected using cost and resource availability information associated with multiple heterogeneous programmable chips and the configuration options provided with the logic blocks.

In one embodiment, a method for selecting an optimized system design is provided. First logic block configuration options for implementing a first logic block on a heterogeneous device are received. The heterogeneous device includes logic elements and digital signal processing blocks. Second logic block configuration options for implementing a second block on the heterogeneous device are received. An optimal set of configurations for implementing the first logic block and the second block on the heterogeneous device is selected.

In another embodiment, a system for selecting an optimized system design is provided. The system includes an interface configured to receive first logic block configuration options for implementing a first logic block on a heterogeneous device and second logic block configuration options for implementing a second block on the heterogeneous device. The heterogeneous device includes logic elements and digital signal processing blocks. The system also includes a processor configured to select an optimal set of configurations for implementing the first logic block and the second block on the heterogeneous device.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

FIG. 6 is a diagrammatic representation showing possible selection results.

DETAILED DESCRIPTION OF SPECIFIC EMBODIMENTS

Figure 1:
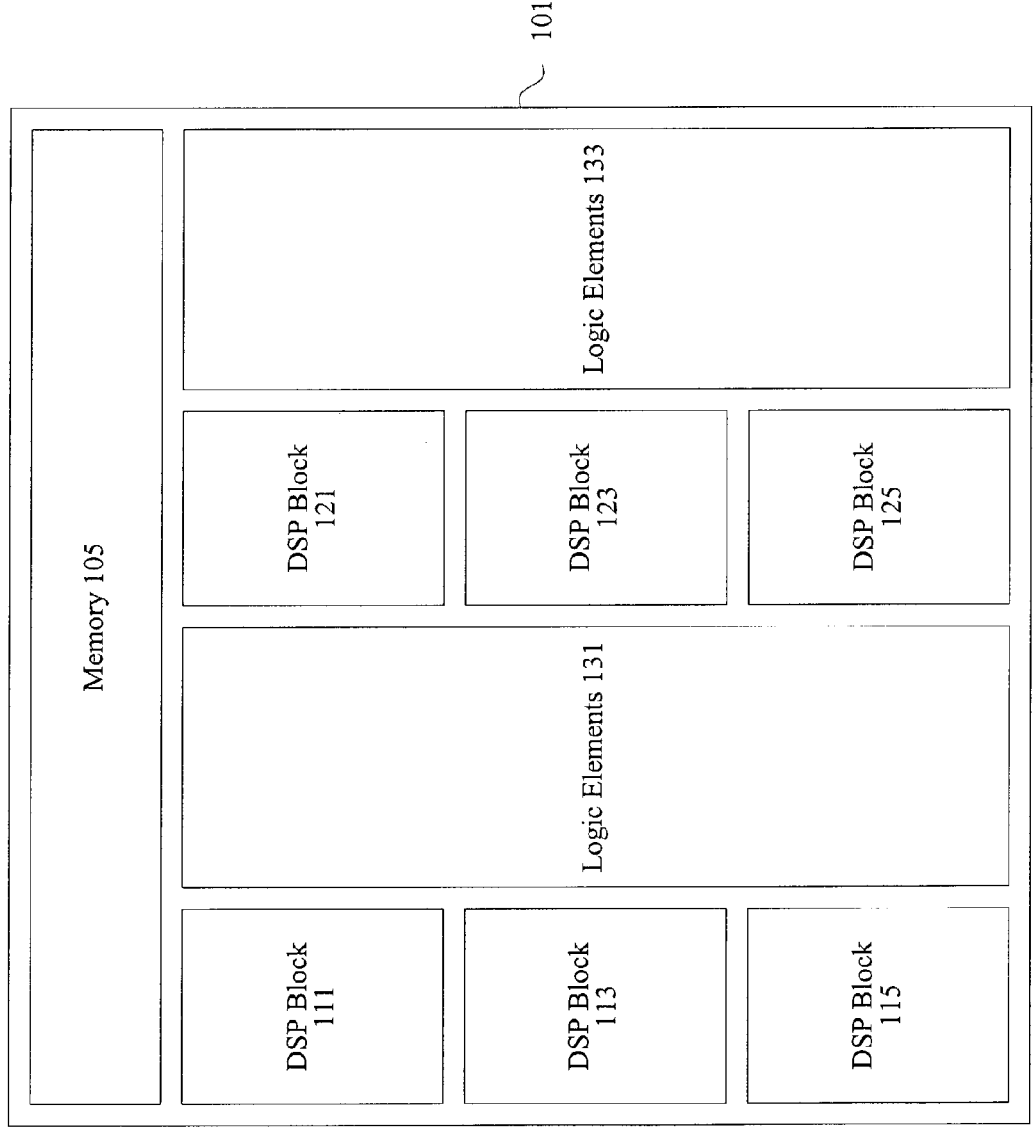
FIG. 1 is a diagrammatic representation showing a device that can be the target of the techniques of the present invention.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of a heterogeneous programmable chip. However, it should be noted that the techniques of the present invention can be applied to a variety of heterogeneous devices.

According to various embodiments, the techniques of the present invention are applicable to programmable devices including a class of ASICs known as structured arrays, embedded gate arrays, or modular arrays. Many of these devices include a mix of logic, memory, and other logic blocks. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Conventional programmable chips include logic that can be customized for specific applications based on the needs of a particular user. Examples of programmable chips include programmable logic devices (PLDs) and field programmable gate arrays (FPGAs). Programmable chips offer advantages over more specialized application-specific integrated circuits (ASICs), such as significant cost savings in non-mass market applications. ASICs are custom-designed integrated circuits for specific usages. Because ASICs are custom-designed, they are often faster compared to programmable chips. However, the process of designing, verifying, fabricating, and testing ASICs is time-consuming and expensive. Any flaw uncovered on a particular ASIC after fabrication is complete requires a vast amount of time and expense to correct. Furthermore, ASICs are not programmable. An ASIC fabricated for specific digital signal processing (DSP) applications can not be reconfigured if the specific applications change.

Programmable chip implementations are sometimes slower than comparable ASIC implementations because the logic programmed onto a programmable chip is generally not optimized as well as customized logic on an ASIC. Consequently, ASICs have often been used in mass-market as well as delay sensitive applications such as some voice over IP (VoIP) or image processing applications. The desire to increase programmable chip performance has led to the integration of specialized resources along with logic elements on a programmable chip. In one particular example, resources such as DSP blocks have been provided along with logic elements on a single programmable chip.

Commonly used DSP functions include finite impulse response (FIR) filters, complex FIR filters, infinite impulse response (IIR) filters, fast Fourier transform (FFT) functions, direct cosine transform (DCT) functions, and correlators. Many of these functions frequently use the multiplier as a fundamental building block and specialized operations such as multiply-add and multiply-accumulate as supplemental building blocks. Although operations such as multiply, multiply-add, and multiply-accumulate can be configured using logic elements, the speed and efficiency of the configuration may not be optimal. Consequently, it is beneficial to provide DSP blocks along with logic elements to allow more efficient implementation of DSP functions on a programmable chip and to allow the use of programmable chips in more delay sensitive applications.

According to various embodiments, the techniques of the present invention allow for the efficient programming of prepackaged logic and customized logic onto a programmable chip with several types of resources.

FIG. 1 is a diagrammatic representation of a heterogeneous programmable chip that can be used with the techniques of the present invention. Any programmable chip containing different types of resource that can be interchangeably used in different allocations to implement that same logic blocks is referred to herein as a heterogeneous programmable chip. In one example, the heterogeneous programmable chip includes memory 105, logic elements 131 and 133, and DSP blocks 111, 113, 115, 121, 123, and 125. Different resources such as DSP blocks can implement a variety of functions faster than LE-based implementations.

It should be noted that although the techniques of the present invention will be described in the context of DSP blocks and logic elements, a variety of resources may be available on a heterogeneous chip. For example, some other resources include phase locked loops (PLLs), arithmetic logic units (ALUs), and multiplexers (MUXes). Logic elements 131 typically can be implemented using components such as antifuses, static RAM, flash memory, and EPROMS. Any mechanism in a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

According to various embodiments, each DSP block includes multiplier blocks and adder/output blocks. The multiplier block includes input registers, a multiplier, and a pipeline register for pipelining multiply-accumulate and multiply-add/subtract functions. In some examples, a DSP block can be configured to support eight 9×9-bit multipliers, four 18×18-bit multipliers, or a single 36×36-bit multiplier.

Figure 2:
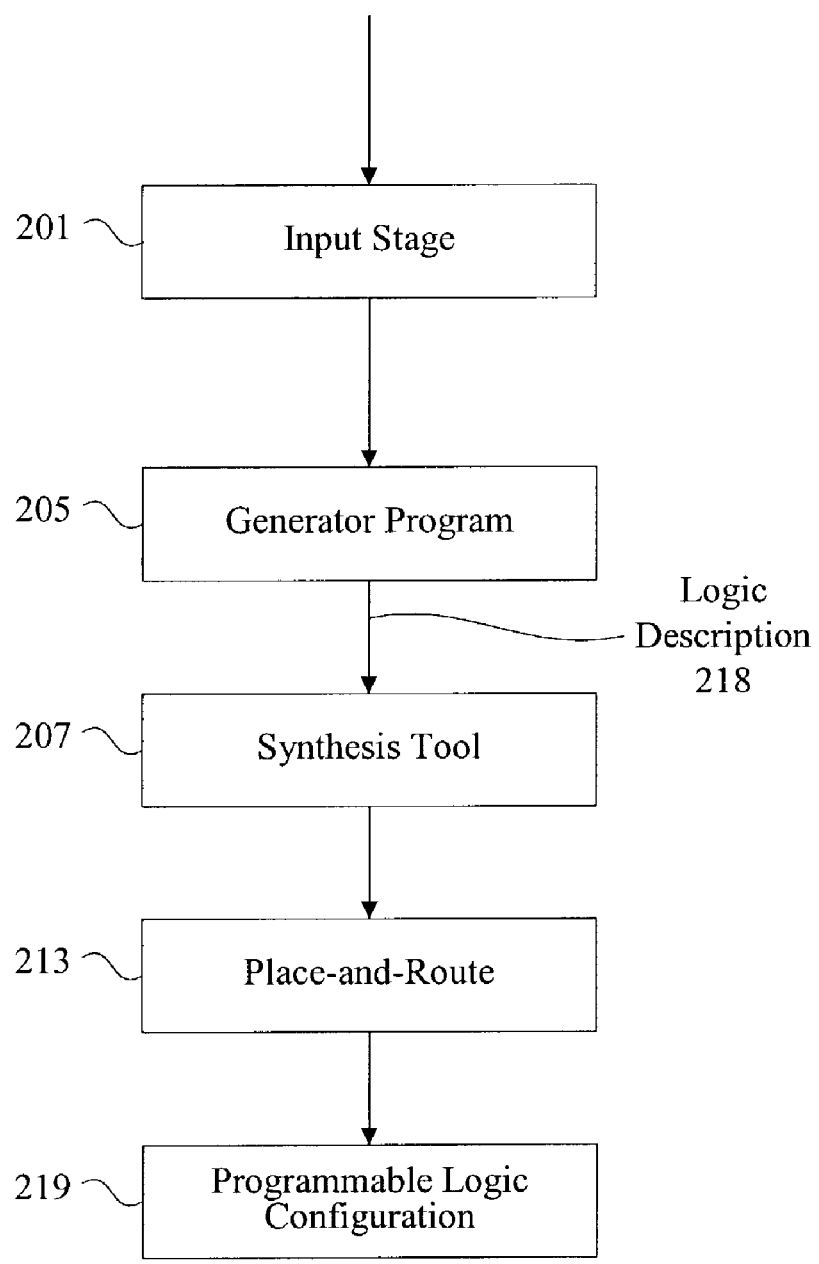
FIG. 2 is a diagrammatic representation showing the programming of the target device.

FIG. 2 is a diagrammatic representation of the various programs, tools, and stages that can be used to implement a programmable chip. An input stage 201 receives selection information typically from a user for logic such as a finite impulse response (FIR) filter and fast fourier transform (FFT) core logic to be implemented on a programmable chip. A generator program 205 creates a logic description of the FIR filter and the FFT core based on user specifications and provides the logic description of the FIR filter and FFT core along with other customized logic to any of a variety of synthesis tools, place and route programs, and programmable logic configuration tools to allow a logic description to be downloaded onto the programmable chip.

More specifically, an input stage 201 allows selection of prepackaged logic to be used with customized logic. Any behavioral, RTL, or presynthesized logic provided as part of a library to a designer for programming functions onto a programmable chip is referred to herein as prepackaged logic. In some examples, prepackaged logic includes intellectual property functions, megafunctions, and intellectual property cores. The input stage 201 may be a graphical user interface using wizards for allowing efficient or convenient entry of information. The input stage may also be a text interface or a program reading a data file such as a spreadsheet, database table, or schematic to acquire selection information. The input stage 201 produces an output containing information about the various modules selected. In this example, the modules selected are a FIR filter and an FFT core.

Prepackaged logic such as intellectual property functions have conventionally encapsulated a single implementation for the specified function. Designers would have to choose between distinct prepackaged logic blocks to implement alternative implementations. In one example, designers could choose between an efficient implementation that used a large number of logic elements or a less efficient implementation that used a smaller number of logic elements. In another example, a designer could select implementations based on the determined layout on a particular chip. However, many typically used techniques for selecting logic blocks or optimizing logic blocks for implementation deal only with programmable devices and allocating logic elements. In other examples, the typically used techniques include analysis of the individual blocks without consideration of the system. According to various embodiments, prepackaged logic is provided which allows a designer to specify alternative implementations from within the same prepackaged logic, typically through an input interface 201. Alternatively, the prepackaged logic or intellectual property function itself can choose an optimal implementation from several options automatically based on the functional specifications entered by the designer.

As designers use multiple blocks of prepackaged logic in a single design on a heterogeneous device, there exists a conflict as the blocks of prepackaged logic or intellectual property functions select the implementation option for each function without considering the choices made by other functions in the same design. For example, if an FIR filter prepackaged logic function and an FFT core prepackaged logic function both choose an implementation that makes heavy use of DSP blocks, then they may force the design into a larger, more expensive programmable chip. A better choice might be for the FIR filter to be implemented fully with logic elements, leaving the DSP blocks for the FFT core. Although the choice to use all LEs for the FIR filter may appear inefficient from the perspective of the single FIR filter function, it would be a more efficient choice from the perspective of the entire programmable chip.

The generator program 205 can identify the selections and generate a logic description with information for implementing the various modules. The generator program 205 can be a Perl script creating HDL files such as Verilog, Abel, VHDL, and AHDL files from the module information entered by a user. According to various embodiments, the generator program 205 can also provide information to a synthesis tool 207 to allow HDL files to be automatically synthesized. Some of the available synthesis tools are Leonardo Spectrum, available from Mentor Graphics Corporation of Wilsonville, Oreg. and Synplify available from Synplicity Corporation of Sunnyvale, Calif.

As will be appreciated by one of skill in the art, the input stage 201, generator program 205, and synthesis tool 207 are separate programs. The interface between the separate programs can be a database file, a log, or simply messages transmitted between the programs. For example, instead of writing a PTF file to storage, the input stage 201 can send messages directly to the generator program 205 to allow the generator program to create a logic description. Similarly, the generator program can provide information directly to the synthesis tool instead of writing HDL files. Similarly, input stage 201, generator program 205, and synthesis tool 207 can be integrated into a single program.

A user may select various modules and an integrated program can then take the user selections and output a logic description in the form of a synthesized netlist without intermediate PTF or HDL files. Any mechanism for depicting the logic to be programmed onto a programmable chip is referred to herein as a logic description. According to various embodiments, a logic description is an HDL file such as a VHDL, Abel, AHDL, or Verilog file. A logic description may be in various stages of processing between the user selection of components and parameters to the final configuration of the programmable chip. According to other embodiments, a logic description is a synthesized netlist such as an EDF file.

A synthesis tool 207 can take HDL files and output EDF files. An EDF file is one example of a synthesized netlist file that can be output by the synthesis tool 207. Various synthesized netlist formats will be appreciated by one of skill in the art. The synthesized netlist file can be read by a place and route tool 213. A place and route tool typically locates logic cells onto specific logic elements of a target hardware device and connects wires between the inputs and outputs of the various logic elements in accordance with logic required to implement an electronic design. A programmable logic configuration stage 219 can take the output of the place and route tool to program the logic device with the user selected and parameterized modules. According to various embodiments, the place and route tool 213 and the programmable logic configuration stage 219 are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

As noted above, different stages and programs can be integrated in a variety of manners. According to one embodiment, the input stage 201, the generator program 205, the synthesis tool 207, the place and route tool 213, and the programmable logic configuration stage 219 are integrated into a single program. The various stages are automatically run and transparent to a user. The program can receive the user selected modules, generate an logic description depicting logic for implementing the various selected modules, and implement the programmable chip. As will be appreciated by one of skill in the art, HDL files and EDF files are mere examples of a logic description. Other file formats as well as internal program representations are other examples of a logic description. Internal program representations can be transitory data used by a program to provide information for implementing FIR filters and FFT cores on programmable chip.

Figure 3:
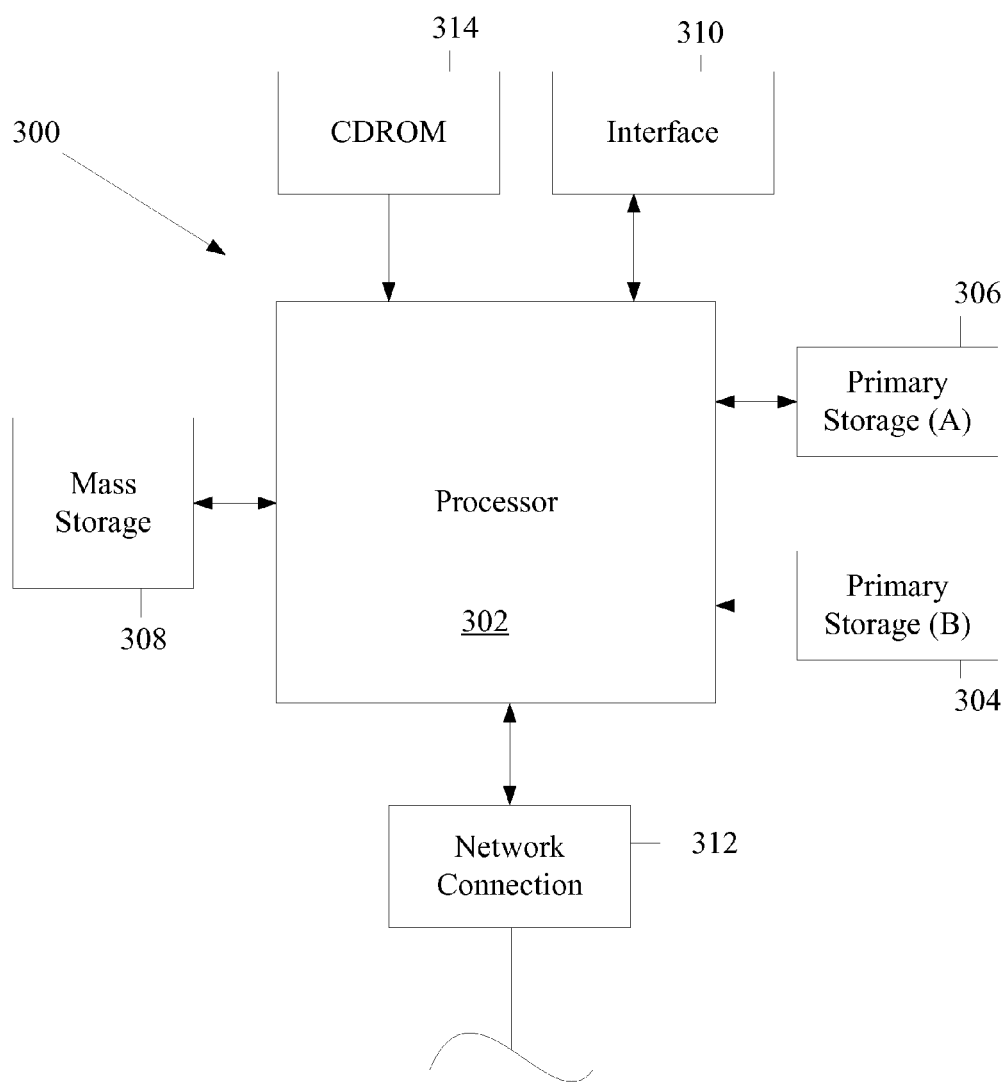
FIG. 3 is a diagrammatic representation of a system for configuring the target device.

FIG. 3 illustrates a typical computer system that can be used to implement a programmable chip in accordance with an embodiment of the present invention. The computer system 300 includes any number of processors 302 (also referred to as central processing units, or CPUs) that are coupled to storage devices including primary storage 306 (typically a random access memory, or "RAM"), primary storage 304 (typically a read only memory, or "ROM"). The processors 302 can be configured to receive selection information from a user to dynamically generate a logic description. As is well known in the art, primary storage 304 acts to transfer data and instructions uni-directionally to the CPU and primary storage 306 is used typically to transfer data and instructions in a bi-directional manner.

Both of these primary storage devices may include any suitable type of the computer-readable media described above. A mass storage device 308 is also coupled bi-directionally to CPU 302 and provides additional data storage capacity and may include any of the computer-readable media described above. The mass storage device 308 may be used to store programs, data and the like and is typically a secondary storage medium such as a hard disk that is slower than primary storage. The mass storage device 308 can be used to hold a library or database of prepackaged logic or intellectual property functions, as well as information on generating particular configurations. It will be appreciated that the information retained within the mass storage device 308, may, in appropriate cases, be incorporated in standard fashion as part of primary storage 306 as virtual memory. A specific mass storage device such as a CD-ROM 314 may also pass data uni-directionally to the CPU.

CPU 302 is also coupled to an interface 310 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 302 optionally may be coupled to a computer or telecommunications network using a network connection as shown generally at 312. With such a network connection, it is contemplated that the CPU might receive information from the network, or might output information to the network in the course of performing the above-described method steps. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 308 or 314 and executed on CPU 308 in conjunction with primary memory 306.

Although many of the components and processes are described above in the singular for convenience, it will be appreciated by one of skill in the art that multiple components and repeated processes can also be used to practice the techniques of the present invention.

Figure 4:
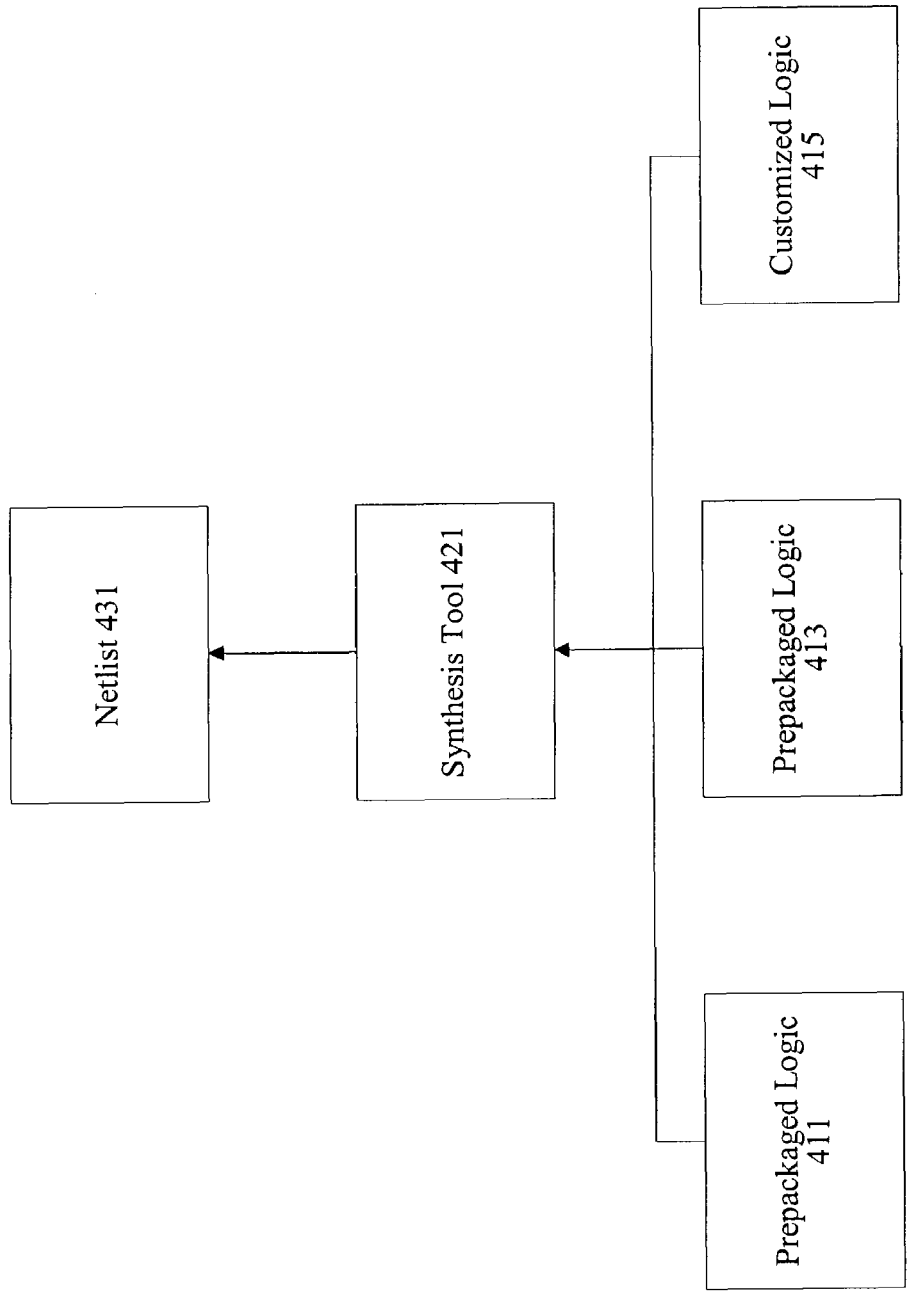
FIG. 4 is a diagrammatic representation showing one technique for generating a netlist using logic blocks

FIG. 4 is a diagrammatic representation showing one technique for generating a netlist for implementing a programmable chip using prepackaged logic as well as customized logic. Prepackaged logic is typically provided as part of a library of functions that are used and implemented on a programmable chip. Prepackaged logic such as intellectual property functions or megafunctions are presynthesized to allow efficient implementation of the function on a programmable device. According to various embodiments, prepackaged logic 411 and 413 are provided along with designer prepared customized logic 415 to a synthesis tool 421. The synthesis tool 421 takes the prepackaged logic along with customized logic and prepares a netlist 431.

A variety of techniques are available for optimizing prepackaged logic blocks 411 and 413. In some examples, behavioral synthesis is used to reduce redundancy and improve efficiency in each logic block. In some instances, different configurations of each prepackaged logic block are provided for user selection. In one example, a FIR filter can be implemented using a large number of DSP blocks and a small number of logic elements or a small number of DSP blocks and a large number of logic elements. A user is provided with the different configuration options and selects a configuration option to provide to a synthesis tool 421. Multiple implementations of the same block using varying amounts of different resources on a programmable chip are referred to herein as configuration options. In other examples, prepackaged logic blocks 411 and 413 are associated with tools for automatically selecting an optimal configuration options. The tools select a configuration option for a particular block without considering the other blocks in the system.

Figure 5:
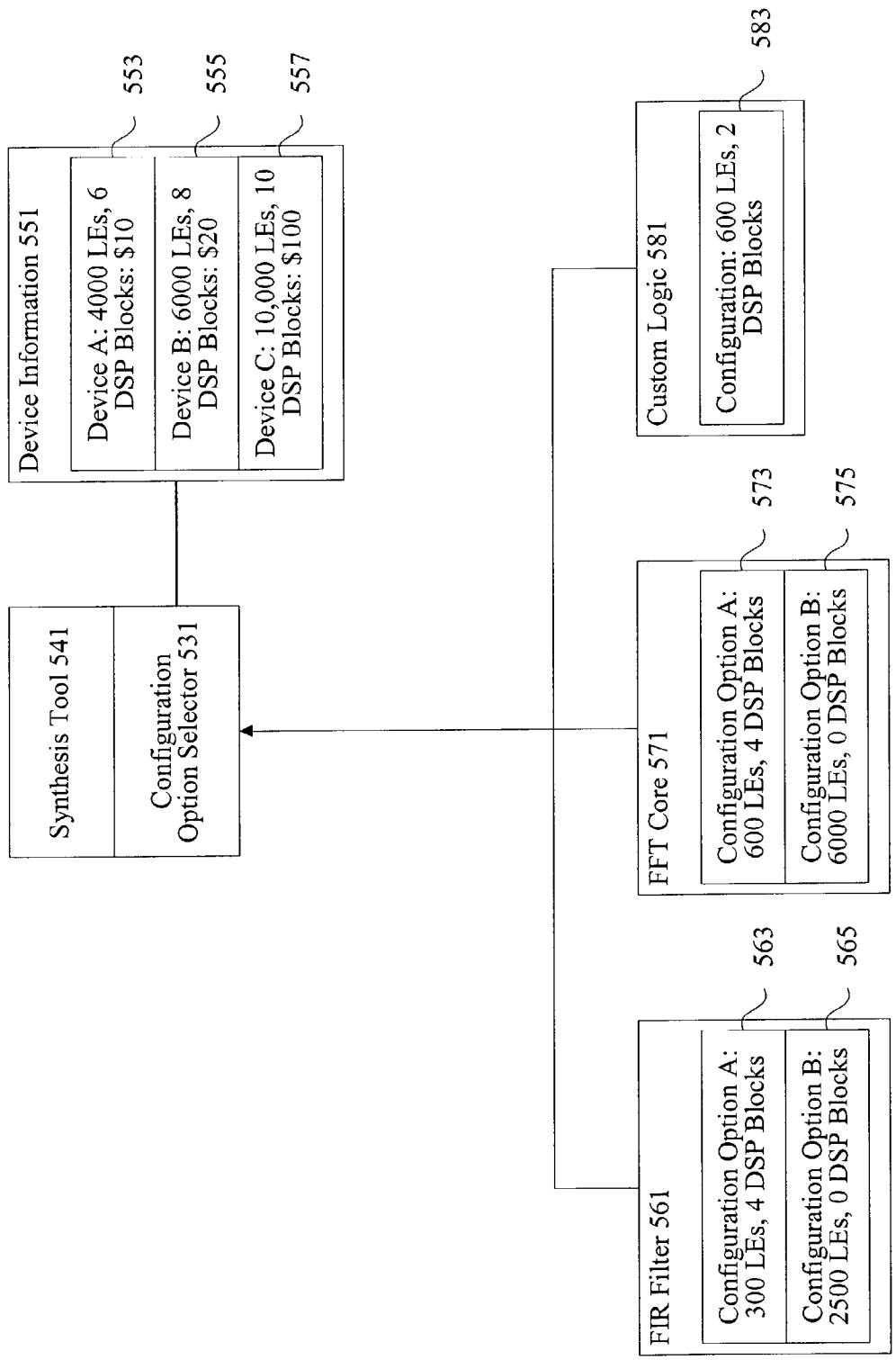
FIG. 5 is a diagrammatic representation showing one technique for selecting configuration options.

FIG. 5 is a diagrammatic representation showing a technique for selecting configuration options using a configuration option selector 531 while considering other logic blocks in a system. According to various embodiments, a configuration option selector 531 is provided to select configuration options associated with FIR filter 561 and FFT core 571. In typical implementations, an intellectual property function such as a FIR filter 561 is provided to the synthesis tool 541 with a single configuration. The configuration for the FIR filter 561 is pre-selected based on local optimal characteristics without considering the characteristics of the other blocks in the system. For example, each prepackaged logic block could entail DSP block intensive configurations. A programmable chip with a large number of DSP blocks would then have to be selected even though other resources such as logic elements or memory on the programmable chip may be underused.

According to various embodiments, the techniques of the present invention allow prepackaged logic blocks to provide different configuration options, using different sets of device resources to meet user specifications. For example, a FIR filter could be configured to provide different configurations to a configuration option selector 531. The configuration option selector 531 would then select the best set of configurations while considering other logic blocks. Any logic or mechanism for selecting configuration options associated with a plurality of logic blocks is referred to herein as a configuration option selector. The individual configuration options selected for various logic blocks to be implemented on a programmable chip is referred to herein as a set of configurations. In one example, the configuration option selector 531 can be implemented as part of a synthesis tool 541 or as a standalone tool. The configuration option selector 531 receives configuration option information associated with prepackaged logic blocks 561 and 571. In another example, the configuration option selector 531 receives configuration option information associated with custom logic 581.

The prepackaged logic FFT core 571 is configured to provide configuration option 573 indicating that the FFT core can be implemented using 600 logic elements and 4 DSP blocks or as configuration option 575 using 6000 logic elements and 0 DSP blocks. The prepackaged FIR filter 561 is configured to provide configuration option 563 indicating that the FIR filter can be implemented using 300 logic elements and 4 DSP blocks or as configuration option 565 using 2500 logic elements and 0 DSP blocks. In one implementation, the custom logic 581 is associated with a single configuration 583 using 600 logic elements and 2 DSP blocks.

The configuration option selector 531 analyzes the different configuration options and selects the optimal set of configurations. In one example, the configuration option selector 531 selects the set of configurations that would allow implementation on the lowest cost device. In another example, configuration option selector 531 selects the set of configurations that would maximize programmable chip performance while minimizing device cost. Any selection criteria can be used and a variety of selection algorithms can be used to find the optimal set of configurations.

According to various embodiments, the configuration option selector 531 has access to programmable chip information 551 with information about the amount of resources and costs associated with various programmable devices. Programmable device information table 551 can include device A 553 with 4000 logic elements, 6 DSP blocks and a cost of $10, device B 555 with 6000 logic elements, 8 DSP blocks and a cost of $20, and device C 557 with 10,000 logic elements, 10 DSP blocks and a cost of $100. Information about the amount of resources available on programmable chips of various costs is referred to herein as programmable chip information.

FIG. 6 is a diagrammatic representation showing configuration option selector results. In entry 611, custom logic 581 is implemented with FIR filter 563 and FFT core 573. The amount of resources used is 1500 logic elements and 10 DSP blocks. To implement the set of configurations in entry 611, device C costing $100 would have to be used since device C is the only programmable chip that includes 10 DSP blocks. In entry 613, custom logic 581 is implemented with FIR filter 563 and FFT core 575. The amount of resources used is 6900 logic elements and 6 DSP blocks. To implement the set of configurations in entry 613, device C costing $100 would have to be used since device C is the only programmable chip that includes 6900 logic elements.

In entry 617, custom logic 581 is implemented with FIR filter 565 and FFT core 575. The amount of resources used is 9100 logic elements and 2 DSP blocks. To implement the set of configurations in entry 617, device C costing $100 would have to be used since device C is the only programmable chip that includes 9100 logic elements. In entry 615, custom logic 581 is implemented with FIR filter 565 and FFT core 573. The amount of resources used is 3700 logic elements and 6 DSP blocks. To implement the set of configurations in entry 617, device A costing only $10 could be used since device A has enough logic elements and DSP blocks to meet this set of configurations.

It should be noted that the selection of an optimal set of configurations is a linear search. In one example, all of the different sets of configuration options can be tried and the set that can be implemented on the lowest cost device is selected.

In another example, possible configuration options for each logic block can be pruned as improved sets of configurations are determined.

Figure 7:
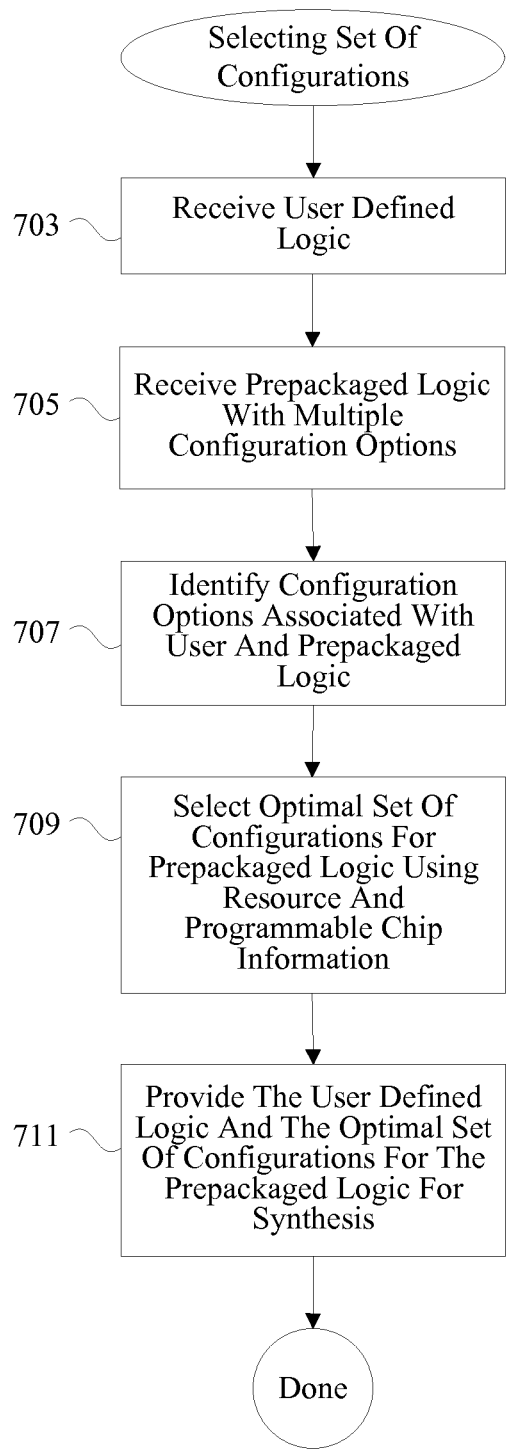
FIG. 7 is a flow process diagram showing a technique for selecting configuration options using presynthesized user logic.

FIG. 7 is a flow process diagram showing a technique for selecting a set of configurations. At 703, user-defined logic is received. According to various embodiments, user-defined logic is custom logic prepared by the designer implementing the programmable chip. At 705, pre-packaged logic with multiple configuration options is received. Pre-packaged logic is typically presynthesized logic blocks provided to a chip designer for efficiency and convenience. According to various embodiments, the configuration options are received as a text description associated with Verilog or VHDL. In one example, VHDL provides capabilities for defining a synthesis configuration option or a simulation configuration option. When a programmable chip is being simulated, a synthesis tool selects the simulation configuration option. When a programmable chip is being programmed, the synthesis tool selects the synthesis configuration option.

According to various embodiments, the synthesis configuration option and the simulation configuration option available in VHDL are used to provide two different synthesis configuration options to a configuration option selector. At 707, configuration option information associated with the user and prepackaged logic is identified. In one example, configuration option information specifies the number of logic elements and the number of phase locked loops used to implement a particular configuration of logic blocks. At 709, the optimal set of configurations is selected upon accessing programmable chip information. In one example, selecting a set of optimal configurations includes identifying the set of configurations that can be implemented on the lowest cost programmable device. At 711, the user-defined logic and the selected set of configurations is provided to a synthesis tool.

Figure 8:
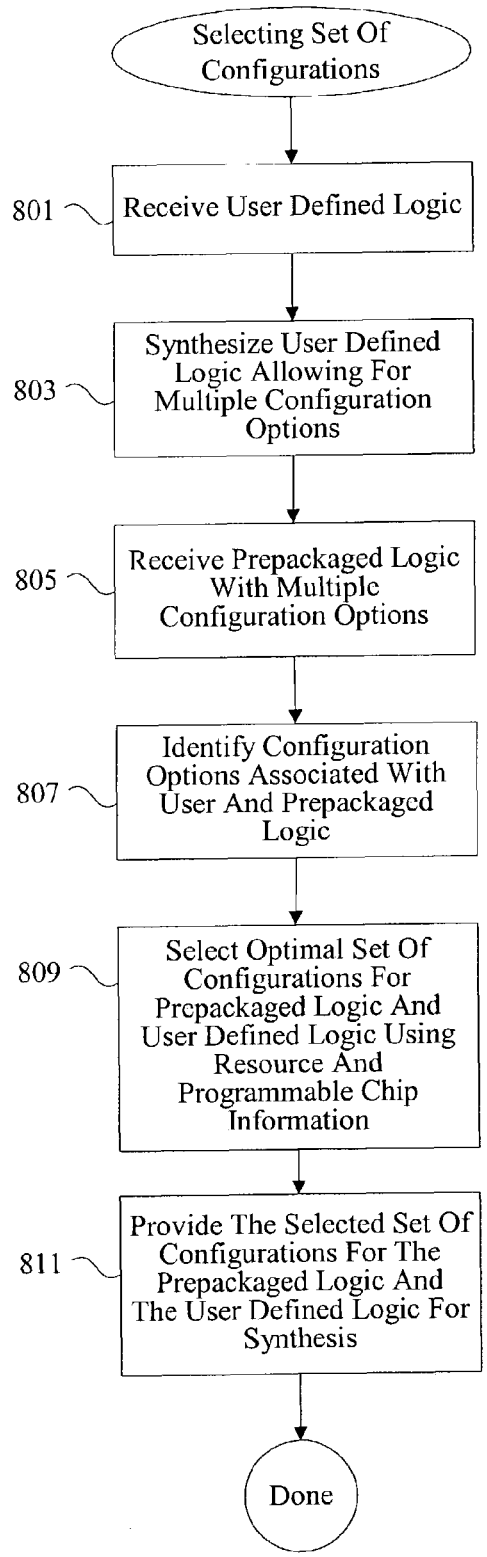
FIG. 8 is a flow process diagram showing a technique for selecting configuration options for user logic.

It should be noted that no configuration options were provided for user-defined logic. In one example, the custom or user-defined logic is the pre-synthesized to determine the amount of resources or the resource utilization of the custom logic. However, the techniques of the present invention recognize that multiple configuration options for custom logic can further enhance the ability of a configuration option selector to find a more optimal set of configurations. FIG. 8 is a flow process diagram showing a selection of a set of configurations where custom logic includes configuration options. At 801, user-defined logic is received. At 803, the user-defined logic is synthesized in different ways to allow for multiple configuration options.

In one example, the user-defined logic is synthesized to use a large number of DSP blocks and a small number of logic elements. In another example, the user-defined logic is synthesized to use a large number of logic elements and a small number of DSP blocks. The multiple configuration options for user-defined logic can be maintained. At 805, prepackaged logic with multiple configuration options is received. Although the configuration options may be received as text associated with Verilog or VHDL, the configuration options may also be received through an application program interface or a database. At 807, configuration options associated with user and prepackaged logic is identified. At 809, an optimal set of configurations for the prepackaged logic and the user-defined logic is selected using programmable chip information. At 811, the selected configuration is provided to a synthesis tool.

While the invention has been particularly shown and described with reference to specific embodiments thereof, it will be understood by those skilled in the art that changes in the form and details of the disclosed embodiments may be made without departing from the spirit or scope of the invention. For example, the embodiments described above may be implemented using firmware, software, or hardware. Moreover, embodiments of the present invention may be employed with a variety of different file formats, languages, and communication protocols and should not be restricted to the ones mentioned above. Therefore, the scope of the invention should be determined with reference to the appended claims.

What is claimed is:

1. A method comprising:
receiving a first logic block provided with a plurality of first logic block configuration options, the first logic block configured to select an optimal first logic block configuration option from the plurality of first logic block configuration options based on designated functional specifications, the plurality of first logic block configuration options identifying a first configuration specifying a first number of logic elements and a second number of digital signal processing blocks and a second configuration specifying a third number of logic elements and a fourth number of digital signal processing blocks, wherein the first, second, third, and fourth numbers are different values;
receiving a second logic block provided with a plurality of second logic block configuration options;
analyzing a plurality of heterogeneous device options, the plurality of first logic block configuration options and the plurality of second logic block configuration options;
selecting a programmable chip optimal first logic block configuration option from the plurality of first logic block configuration options using a linear search of combinations of configuration options comprising one option from the plurality of first logic block configuration options and one option from the plurality of second logic block configuration options;
implementing the first logic block and the second logic block on a heterogeneous device.

2. The method of claim 1, wherein first logic block configuration options are received as part of a prepackaged logic block.

3. The method of claim 1, wherein first logic block configuration options are received as part of an intellectual property function.

4. The method of claim 1, wherein selecting one of the plurality of first logic block configuration options and one of the plurality of second logic block configuration options comprises identifying pairings of first logic block configuration options and second logic block configuration options, wherein the pairings use resources corresponding to the amount of resources available on a particular programmable chip.

5. The method of claim 1, wherein a configuration option selector selects one of the plurality of first logic block configuration options and one of the plurality of second logic block configuration options.

6. The method of claim 1, further comprising receiving a custom logic block.

7. The method of claim 1, further comprising receiving a third logic block provided with a plurality of third logic block configuration options, the plurality of third logic block configuration options identifying different allocations of logic elements and digital signal processing blocks used to implement the third logic block on the heterogeneous device, wherein the third block is a custom logic block.

8. The method of claim 7, wherein the configuration options are provided as text in VHDL.

9. The method of claim 8, wherein the configuration options are provided as simulation and synthesis options in VHDL.

10. The method of claim 1, wherein one of the plurality of first logic block configuration options and one of the plurality of second logic block configuration options are selected by a synthesis tool.

11. The method of claim 10, wherein the first logic block implements a FIR filter.

12. The method of claim 11, wherein the second block implements an FFT core.

13. The method of claim 1, wherein first logic block configuration options include information on the amount of different types of resources needed to implement the first logic block.

14. A system for selecting an optimized system design, the system comprising:

a interface configured to receive a first logic block provided with a plurality of first logic block configuration options and a second logic block provided with a plurality of second logic block configuration options, the first logic block configured to select an optimal first logic block configuration option from the plurality of first logic block configuration options based on designated functional specifications, the plurality of first logic block configuration options identifying a first configuration specifying a first number of logic elements and a second number of digital signal processing blocks and a second configuration specifying a third number of logic elements and a fourth number of digital signal processing blocks, wherein the first, second, third, and fourth numbers are different values of logic elements and digital signal processing blocks and wherein the first, second, third and fourth numbers are used to implement the first logic block on a heterogeneous device, the heterogeneous device including logic elements and digital signal processing blocks; and a processor configured to analyze a plurality of heterogeneous device options, the plurality of first logic block configuration options and the plurality of second logic block configuration options to select a programmable chip optimal first logic block configuration option from the plurality of first logic block configuration options using a linear search of combinations of configuration options comprising one option from the plurality of first logic block configuration options and one option from the plurality of second logic block configuration options, the processor further configured to implement the first logic block and the second logic block on the heterogeneous device.

15. The system of claim 14, wherein first logic block configuration options are received as part of a prepackaged logic block.

16. The system of claim 14, wherein first logic block configuration options are received as part of an intellectual property function.

17. The system of claim 14, wherein selecting one of the plurality of first logic block configuration options and one of the plurality of second logic block configuration options comprises identifying pairings of first logic block configuration options and second logic block configuration options that can be implemented on a particular programmable chip.

18. The system of claim 14, wherein a configuration option selector selects one of the plurality of first logic block configuration options and one of the plurality of second logic block configuration options.

19. The system of claim 14, further comprising receiving a custom logic block.

20. The system of claim 14, wherein the interface is further configured to receive a third logic block provided with a plurality of third logic block configuration options, the plurality of third logic block configuration options identifying different allocations of logic elements and digital signal processing blocks used to implement the third logic block on the heterogeneous device, wherein the third block is a custom logic block.

21. The system of claim 20, wherein the configuration options are provided as text in VHDL.

22. The system of claim 21, wherein the configuration options are provided as simulation and synthesis options in VHDL.

23. The system of claim 14, wherein one of the plurality of first logic block configuration options and one of the plurality of second logic block configuration options are selected by a synthesis tool.

24. The system of claim 23, wherein the first logic block implements a FIR filter.

25. The system of claim 24, wherein the second block implements an FFT core.

26. The system of claim 14, wherein first logic block configuration options include information on the amount of different types of resources needed to implement the first logic block.

27. A computer readable medium having computer code embodied therein, computer readable medium comprising:

computer code embodied on the computer readable medium for receiving a first logic block provided with a plurality of first logic block configuration options, the first logic block configured to select an optimal first logic block configuration option from the plurality of first logic block configuration options based on designated functional specifications, the plurality of first logic block configuration options identifying a first configuration specifying a first number of logic elements and a second number of digital signal processing blocks and a second configuration specifying a third number of logic elements and a fourth number of digital signal processing blocks, wherein the first, second, third, and fourth numbers are different values;

computer code embodied on the computer readable medium for receiving a second logic block provided with a plurality of second logic block configuration options;

computer code embodied on the computer readable medium for analyzing a plurality of heterogeneous device options, the plurality of first logic block configuration options and the plurality of second logic block configuration options;

computer code embodied on the computer readable medium for selecting a programmable chip optimal first logic block configuration option from the plurality of first logic block configuration options using a linear search of combinations of configuration options comprising one option from the plurality of first logic block configuration options and one option from the plurality of second logic block configuration options;

computer code embodied on the computer readable medium for implementing the first logic block and the second logic block on a heterogeneous device.

28. The computer readable medium of claim 27, wherein first logic block configuration options are received as part of a prepackaged logic block.

29. The computer readable medium of claim 27, wherein first logic block configuration options are received as part of an intellectual property function.

30. A system for selecting a system design, the system comprising:

means for receiving a first logic block provided with a plurality of first logic block configuration options, the first logic block configured to select an optimal first logic block configuration option from the plurality of first logic block configuration options based on designated functional specifications, the plurality of first logic block configuration options identifying a first configuration specifying a first number of logic elements and a second number of digital signal processing blocks and a second configuration specifying a third number of logic elements and a fourth number of digital signal processing blocks, wherein the first, second, third, and fourth numbers are different values;

means for receiving a second logic block provided with a plurality of second logic block configuration options;

means for analyzing a plurality of heterogeneous device options, the plurality of first logic block configuration options and the plurality of second logic block configuration options;

means for selecting a programmable chip optimal first logic block configuration option from the plurality of first logic block configuration options using a linear search of combinations of configuration options comprising one option from the plurality of first logic block configuration options and one option from the plurality of second logic block configuration options;

means for implementing the first logic block and the second logic block on a heterogeneous device.

31. The system of claim 30, wherein first logic block configuration options are received as part of a prepackaged logic block.

32. The system of claim 30, wherein first logic block configuration options are received as part of an intellectual property function.

* * * * *